(12) United States Patent
Takamine

(10) Patent No.: US 10,367,468 B2
(45) Date of Patent: Jul. 30, 2019

(54) MULTIPLEXER, HIGH-FREQUENCY FRONT END CIRCUIT, AND COMMUNICATION APPARATUS

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 15/846,376

(22) Filed: Dec. 19, 2017

(65) Prior Publication Data

US 2018/0123556 A1  May 3, 2018

Related U.S. Application Data

(63) Continuation of application No. PCT/JP2016/097573, filed on Jun. 13, 2016.

(30) Foreign Application Priority Data

Jun. 25, 2015 (JP) ................... 2015-127146

(51) Int. Cl.
*H03H 9/64* (2006.01)
*H03H 9/72* (2006.01)
(Continued)

(52) U.S. Cl.
CPC ..... *H03H 9/02086* (2013.01); *H01L 41/1873* (2013.01); *H03H 9/02574* (2013.01);
(Continued)

(58) Field of Classification Search
CPC .................................. H03H 9/64–725
See application file for complete search history.

(56) References Cited

U.S. PATENT DOCUMENTS 7,289,008 B2 * 10/2007 Kuroki ................... H03H 9/725
333/133
9,831,848 B2 * 11/2017 Watanabe ............ H03H 9/0222
(Continued)

FOREIGN PATENT DOCUMENTS

JP   2013-062556 A   4/2013
JP   2013-157839 A   8/2013
(Continued)

OTHER PUBLICATIONS

Official Communication issued in International Patent Application No. PCT/JP2016/067573, dated Aug. 23, 2016.
(Continued)

*Primary Examiner* — Dean O Takaoka
*Assistant Examiner* — Alan Wong
(74) *Attorney, Agent, or Firm* — Keating & Bennett, LLP

(57) ABSTRACT

A multiplexer is provided on a mounting substrate and includes a duplexer with first and second bandpass filters, and at least one bandpass filter other than the duplexer. The first and second bandpass filters respectively include first and second multilayer bodies that are different components. Configurations of the first and second multilayer bodies are different from each other such that a frequency range of high-order mode spurious radiation generated in the duplexer and a pass band of the bandpass filter other than the duplexer is different from each other.

20 Claims, 8 Drawing Sheets

(51) Int. Cl.
　　　*H03H 9/02*　　　(2006.01)
　　　*H01L 41/187*　　(2006.01)
　　　*H03H 9/13*　　　(2006.01)
　　　*H03H 9/54*　　　(2006.01)
　　　*H03H 9/70*　　　(2006.01)
　　　*H04B 1/00*　　　(2006.01)
　　　*H03H 9/05*　　　(2006.01)
　　　*H03H 9/145*　　(2006.01)

(52) U.S. Cl.
　　　CPC .......... *H03H 9/059* (2013.01); *H03H 9/0576* (2013.01); *H03H 9/13* (2013.01); *H03H 9/14594* (2013.01); *H03H 9/54* (2013.01); *H03H 9/6436* (2013.01); *H03H 9/6483* (2013.01); *H03H 9/703* (2013.01); *H03H 9/725* (2013.01); *H04B 1/0057* (2013.01)

(56) References Cited

U.S. PATENT DOCUMENTS 9,998,097 B2 * 6/2018 Takeuchi .......... H03H 9/02559

| | | |
|---|---|---|
| 2001/0029648 A1 | 10/2001 | Ikada et al. |
| 2008/0074212 A1 | 3/2008 | Matsuda et al. |
| 2012/0274417 A1 | 11/2012 | Kihara et al. |
| 2013/0285768 A1 | 10/2013 | Watanabe et al. |
| 2014/0225684 A1 | 8/2014 | Kando et al. |
| 2015/0194948 A1 | 7/2015 | Inate |

FOREIGN PATENT DOCUMENTS

| | | |
|---|---|---|
| JP | 5720797 B2 | 5/2015 |
| JP | 2015-115870 A | 6/2015 |
| KR | 2001-0091981 A | 10/2001 |
| KR | 10-0900874 B1 | 6/2009 |
| KR | 10-2015-0044939 A | 4/2015 |
| WO | 2012/086639 A1 | 6/2012 |

OTHER PUBLICATIONS

Official Communication issued in Korean Patent Application No. 10-2017-7036682, dated Mar. 20, 2019.

\* cited by examiner

MULTIPLEXER, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2015-127146 filed on Jun. 25, 2015 and is a Continuation Application of PCT Application No. PCT/JP2016/067573 filed on Jun. 13, 2016. The entire contents of each application are hereby incorporated herein by reference.

BACKGROUND OF THE INVENTION

1. Field of the Invention

The present invention relates to a multiplexer, a high-frequency front end circuit, and a communication apparatus including a plurality of bandpass filters having different pass bands.

2. Description of the Related Art

Carrier aggregation (CA) or the like has been used in order to increase the speed of communication. The CA, in general, increases the speed of communication by commonly using an antenna terminal by a plurality of filters and simultaneously transmitting and receiving a plurality of signals having different frequency bands. In the CA, a multiplexer including a plurality of bandpass filters having different pass bands is widely used.

International Publication No. 2012/086639 discloses an elastic wave device that is able to be used as a bandpass filter of a multiplexer. The elastic wave device includes a support substrate, a high acoustic velocity film laminated on the support substrate, a low acoustic velocity film laminated on the high acoustic velocity film, and a piezoelectric film laminated on the low acoustic velocity film. An IDT electrode is provided on the piezoelectric film.

When a multiplexer including the elastic wave device as disclosed in International Publication No. 2012/086639 is configured while an antenna terminal is commonly used by a plurality of filters, formation of predetermined filters as one chip generates high-order mode spurious radiation in a frequency range at the higher frequency side relative to a pass band of the above-mentioned elastic wave device in some cases. Therefore, attenuation in a pass band of the bandpass filter other than the above-mentioned elastic wave device cannot be sufficiently increased in filter characteristics of the above-mentioned elastic wave device.

SUMMARY OF THE INVENTION

Preferred embodiments of the present invention provide multiplexers including a duplexer and a bandpass filter other than the duplexer and configured such that attenuation in a pass band of the other bandpass filter is increased in the filter characteristics of the duplexer. Preferred embodiments of the present invention also provide high-frequency front end circuits and communication apparatuses including the above-described multiplexers.

A multiplexer according to a preferred embodiment of the present invention, which is provided on a mounting substrate, includes an antenna terminal, and a plurality of bandpass filters that are commonly connected to the antenna terminal and have different pass bands, wherein the plurality of bandpass filters include first and second bandpass filters including first and second piezoelectric substrates and at least one bandpass filter other than the first and second bandpass filters, and the first and second bandpass filters define a duplexer, the first bandpass filter includes a first multilayer body in which the first piezoelectric substrate is laminated on a first support substrate including a first high acoustic velocity member having an acoustic velocity of propagating bulk waves, which is higher than an acoustic velocity of elastic waves propagating in the first piezoelectric substrate, and a first IDT electrode is laminated on the first piezoelectric substrate, the second bandpass filter includes a second multilayer body in which the second piezoelectric substrate is laminated on a second support substrate including a second high acoustic velocity member having an acoustic velocity of propagating bulk waves, which is higher than an acoustic velocity of elastic waves propagating in the second piezoelectric substrate, and a second IDT electrode is laminated on the second piezoelectric substrate, the first bandpass filter and the second bandpass filter are different components on the mounting substrate, and a configuration of the first multilayer body and a configuration of the second multilayer body are different from each other, such that frequency ranges of high-order mode spurious radiation which is generated in the first and second bandpass filters and a pass band of the bandpass filter other than the first and second bandpass filters among the plurality of bandpass filters are different from each other.

In a multiplexer according to a preferred embodiment of the present invention, the first multilayer body includes a first low acoustic velocity film that is laminated between the first support substrate and the first piezoelectric substrate and has an acoustic velocity of propagating bulk waves, which is lower than the acoustic velocity of the elastic waves propagating in the first piezoelectric substrate, and the second multilayer body includes a second low acoustic velocity film that is laminated between the second support substrate and the second piezoelectric substrate and has an acoustic velocity of propagating bulk waves, which is lower than the acoustic velocity of the elastic waves propagating in the second piezoelectric substrate. In this case, a Q value is able to be further increased.

In another specific aspect of the multiplexer according to the above aspect of the present invention, a thickness of the first low acoustic velocity film and a thickness of the second low acoustic velocity film are different from each other. In this case, the attenuation in the pass band of the bandpass filter other than the first and second bandpass filters is able to be further increased in the filter characteristics of the first and second bandpass filters.

In a multiplexer according to a preferred embodiment of the present invention, a thickness of the first IDT electrode and a thickness of the second IDT electrode are different from each other. In this case, the attenuation in the pass band of the bandpass filter other than the first and second bandpass filters is able to be further increased in the filter characteristics of the first and second bandpass filters.

In a multiplexer according to a preferred embodiment of the present invention, a thickness of the first piezoelectric substrate and a thickness of the second piezoelectric substrate are different from each other. In this case, the attenuation in the pass band of the bandpass filter other than the first and second bandpass filters is able to be further increased in the filter characteristics of the first and second bandpass filters.

In a multiplexer according to a preferred embodiment of the present invention, the first support substrate is a first high acoustic velocity substrate defined by the first high acoustic velocity member and the second support substrate is a second high acoustic velocity substrate defined by the second high acoustic velocity member. In this case, the Q value is able to be increased.

In a multiplexer according to a preferred embodiment of the present invention, the first high acoustic velocity substrate and the second high acoustic velocity substrate are made of Si and a crystal orientation in the first high acoustic velocity substrate and a crystal orientation in the second high acoustic velocity substrate are different from each other. In this case, the attenuation in the pass band of the bandpass filter other than the first and second bandpass filters is able to be further increased in the filter characteristics of the first and second bandpass filters.

In a multiplexer according to a preferred embodiment of the present invention, the first and second piezoelectric substrates are made of $LiTaO_3$.

In a multiplexer according to a preferred embodiment of the present invention, the first bandpass filter or the second bandpass filter is provided on the same support substrate as at least one bandpass filter other than the first and second bandpass filters, and is defined by an integrated component. In this case, the multiplexer is able to be reduced in size.

In a multiplexer according to a preferred embodiment of the present invention, the first bandpass filter, the second bandpass filter, and the bandpass filter other than the first and second bandpass filters are provided on different support substrates and are defined by different components. In this case, Q values is able to be increased in the respective bandpass filters. Furthermore, the attenuation in the pass band of the bandpass filter other than the first and second bandpass filters is able to be increased in the filter characteristics of the first and second bandpass filters.

A multiplexer according to a preferred embodiment of the present invention includes an antenna terminal, and a plurality of bandpass filters that are commonly connected to the antenna terminal and have different pass bands, wherein the plurality of bandpass filters include first and second bandpass filters including first and second piezoelectric substrates and at least one bandpass filter other than the first and second bandpass filters, and the first and second bandpass filters define a duplexer, the first bandpass filter includes a first multilayer body in which a first low acoustic velocity film having an acoustic velocity of propagating bulk waves, which is lower than an acoustic velocity of elastic waves propagating in the first piezoelectric substrate, is laminated on a first high acoustic velocity substrate having an acoustic velocity of propagating bulk waves, which is higher than the acoustic velocity of the elastic waves propagating in the first piezoelectric substrate, the first piezoelectric substrate is laminated on the first low acoustic velocity film, and a first IDT electrode is laminated on the first piezoelectric substrate, and the first bandpass filter is a reception filter having a pass band equal to or higher than about 1930 MHz and equal to or lower than about 1995 MHz, the second bandpass filter includes a second multilayer body in which a second low acoustic velocity film having an acoustic velocity of propagating bulk waves, which is lower than an acoustic velocity of elastic waves propagating in the second piezoelectric substrate, is laminated on a second high acoustic velocity substrate having an acoustic velocity of propagating bulk waves, which is higher than the acoustic velocity of the elastic waves propagating in the second piezoelectric substrate, the second piezoelectric substrate is laminated on the second low acoustic velocity film, and a second IDT electrode is laminated on the second piezoelectric substrate, and the second bandpass filter is a transmission filter having a pass band of equal to or higher than about 1850 MHz and equal to or lower than about 1915 MHz, and a thickness of the first piezoelectric substrate is larger than a thickness of the second piezoelectric substrate. In this case, a Q value is able to be increased. Furthermore, attenuation in a pass band of the band pass filter other than the first and second bandpass filters is able to be further increased in filter characteristics of the first and second bandpass filters.

In a multiplexer according to a preferred embodiment of the present invention, frequency ranges of high-order mode spurious radiation which is generated in the first and second bandpass filters are different from all of frequency ranges of equal to or higher than about 1705 MHz and equal to or lower than about 1755 MHz, equal to or higher than about 2105 MHz and equal to or lower than about 2155 MHz, equal to or higher than about 2305 MHz and equal to or lower than about 2315 MHz, and equal to or higher than about 2350 MHz and equal to or lower than about 2360 MHz. In this case, the attenuation in the respective pass bands as described above is able to be further increased in the filter characteristics of the first and second bandpass filters.

A high-frequency front end circuit according to a preferred embodiment of the present invention includes a multiplexer according to a preferred embodiment of the present invention.

A communication apparatus according to a preferred embodiment of the present invention includes a multiplexer according to a preferred embodiment of the present invention.

Preferred embodiments of the present invention provide multiplexers that are able to increase attenuation in a pass band of another bandpass filter in filter characteristics of first and second bandpass filters of a duplexer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be explained by describing specific preferred embodiments of the present invention with reference to the drawings.

It should be noted that respective preferred embodiments which are described in the specification are exemplary and partial replacement or combination of components between different preferred embodiments may be made.

Figure 1:
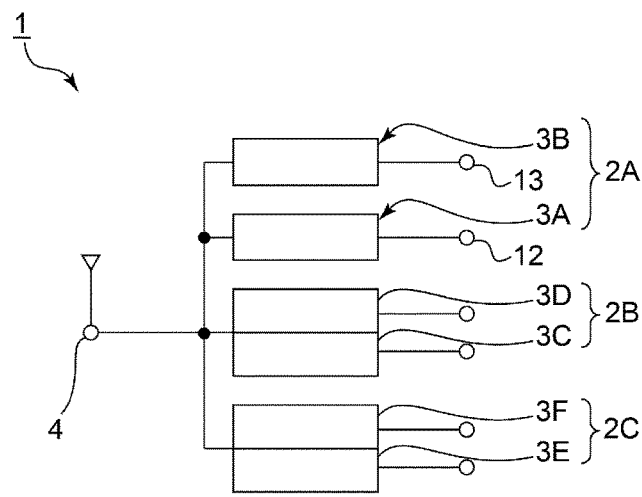
FIG. 1 is a schematic view of a multiplexer according to a first preferred embodiment of the present invention.

FIG. 1 is a schematic view of a multiplexer according to a first preferred embodiment of the present invention.

A multiplexer 1 includes an antenna terminal 4. The antenna terminal 4 is connected to an antenna. The multiplexer 1 includes first to sixth bandpass filters 3A to 3F that are commonly connected to the antenna terminal 4 and have different pass bands. To be more specific, the multiplexer 1 includes first to third duplexers 2A to 2C. Each of the first to third duplexers 2A to 2C includes two bandpass filters. The first duplexer 2A is preferably a duplexer having a pass band of Band 25, for example. The second duplexer 2B is preferably a duplexer having a pass band of Band 4, for example. The third duplexer 2C is preferably a duplexer having a pass band of Band 30, for example.

Figure 2:
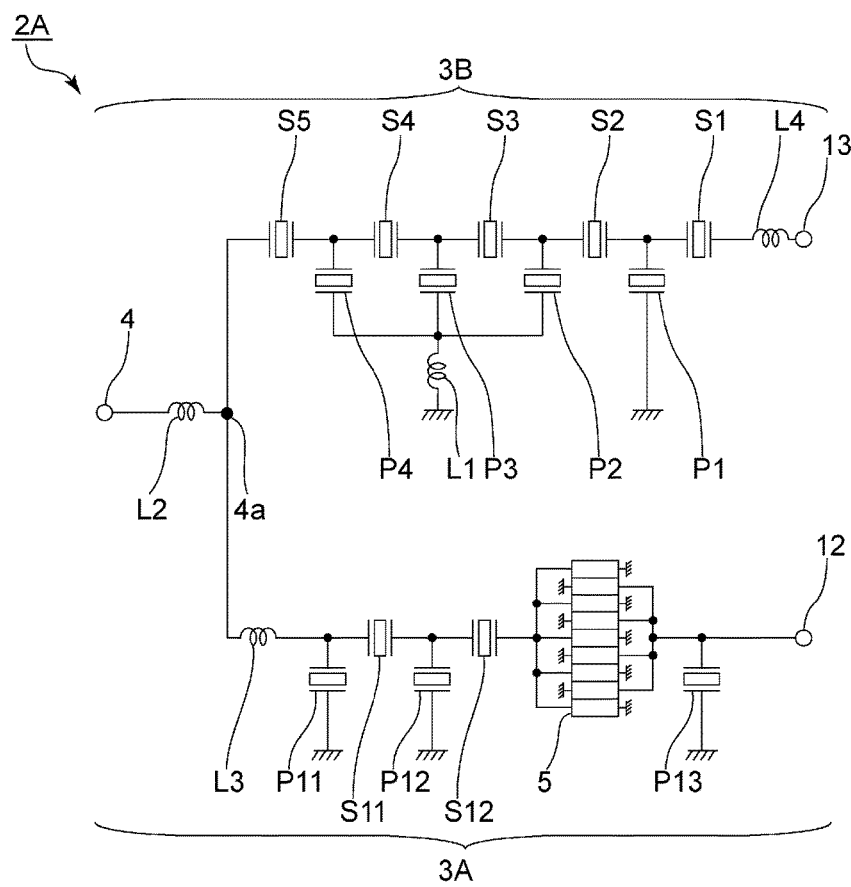
FIG. 2 is a circuit diagram of a first duplexer in the first preferred embodiment of the present invention.

FIG. 2 is a circuit diagram of the first duplexer in the first preferred embodiment.

The first duplexer 2A includes the first and second bandpass filters 3A and 3B. In the preferred embodiment, the first bandpass filter 3A is a reception filter. The first bandpass filter 3A includes resonators S11, S12, and P11 to P13, and a longitudinally coupled resonator elastic wave filter 5. The second bandpass filter 3B is a transmission filter. The second bandpass filter 3B is a ladder filter including series arm resonators S1 to S5 and parallel arm resonators P1 to P4. The circuit configuration will be described in detail later.

Figure 3:
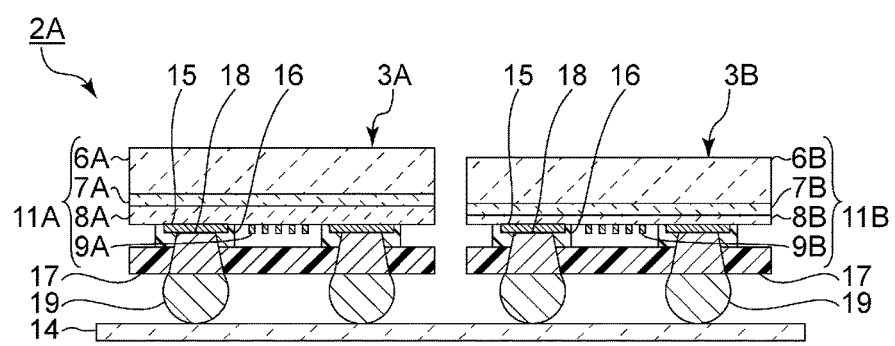
FIG. 3 is a schematic cross-sectional front view in a state in which first and second bandpass filters are mounted as different components on a mounting substrate in the first preferred embodiment of the present invention.

FIG. 3 is a schematic cross-sectional front view in a state in which the first and second bandpass filters are mounted as different components (different chips) on a mounting substrate in the first preferred embodiment. The component herein is a segmented element that is provided on the mounting substrate.

The first and second bandpass filters 3A and 3B respectively include first and second piezoelectric substrates 8A and 8B. The thickness of the first piezoelectric substrate 8A is preferably larger than the thickness of the second piezoelectric substrate 8B. The first and second piezoelectric substrates 8A and 8B are preferably made of $LiTaO_3$ having Cut-Angles of 50°, for example. A material of the piezoelectric substrate is not particularly limited and any of $LiTaO_3$, $LiNbO_3$, $ZnO$, $AlN$, and $PZT$ may be preferably used. The piezoelectric substrate has a structure including a support substrate, a low acoustic velocity film provided on the support substrate, and a piezoelectric thin film provided on the low acoustic velocity film. The piezoelectric thin film is preferably equal to or smaller than about 3.5 λ, for example, when a wavelength of elastic waves, which is determined by an electrode period of an IDT electrode, is λ. An electromechanical coupling coefficient is able to be easily adjusted by selecting the film thickness of the piezoelectric thin film in a range of equal to or smaller than about 1.5 λ, for example. In addition, the thickness of the piezoelectric thin film in a range of about 1.5 λ to about 3.5 λ, for example, is able to not only increase a Q value but also reduce or prevent characteristic variation due to variation in the piezoelectric thin film.

The first bandpass filter 3A includes a first high acoustic velocity substrate 6A as a first support substrate defined by a first high acoustic velocity member. The first high acoustic velocity substrate 6A is a substrate preferably having an acoustic velocity of propagating bulk waves, which is higher than an acoustic velocity of elastic waves propagating in the first piezoelectric substrate 8A. The first high acoustic velocity substrate 6A is preferably made of Si, for example. The first high acoustic velocity substrate may be made of an appropriate material other than Si, which satisfies the above-described relationship for the acoustic velocity.

The acoustic velocity of the bulk waves is unique to a material and the bulk waves include P waves vibrating in a wave traveling direction, that is, a longitudinal direction and S waves vibrating in a transverse direction perpendicular or substantially perpendicular to the traveling direction. The above-described bulk waves also propagate in all of the piezoelectric substrate, the high acoustic velocity member, and the low acoustic velocity film. When an isotropic material is used, P waves and S waves are present. When an anisotropic material is used, the P waves, slow S waves, and fast S waves are present. When surface acoustic waves are excited using the anisotropic material, SH waves and SV waves are generated as the two S waves. In the specification, the acoustic velocity of the elastic waves of a main mode, which propagate in the piezoelectric substrate, indicates that of a mode that is used for providing a pass band as a filter and resonance characteristics as a resonator among three modes of the P waves, the SH waves, and the SV waves.

A first low acoustic velocity film 7A is laminated on the first high acoustic velocity substrate 6A. The first low acoustic velocity film 7A is a film having an acoustic velocity of propagating bulk waves, which is lower than the acoustic velocity of the elastic waves propagating in the first piezoelectric substrate 8A. The first low acoustic velocity film 7A is preferably made of $SiO_2$, for example. The first low acoustic velocity film may be made of an appropriate material other than $SiO_2$, which has a relatively low acoustic velocity of the above-described bulk waves. As such a material, silicon oxide, glass, silicon oxynitride, tantalum oxide, and compounds provided by adding fluorine, carbon, or boron to silicon oxide may be used. The first low acoustic velocity film may be made of a mixture material including any of these materials as a main component.

In the present preferred embodiment, the first high acoustic velocity substrate 6A defined by only the first high acoustic velocity member is used for the first support substrate. However, in the present invention, the entire first support substrate is not necessarily defined by the first high acoustic velocity member as long as the first support substrate includes the first high acoustic velocity member. For example, a layer defined by the first high acoustic velocity member may be laminated on an insulating substrate. An entire second support substrate is also not necessarily defined by a second high acoustic velocity member as long as the second support substrate includes a second high acoustic velocity member.

A close contact layer may preferably be provided between the high acoustic velocity member and the piezoelectric substrate. When the close contact layer is provided, close contact property between the high acoustic velocity member and the piezoelectric substrate is able to be improved. It is sufficient that the close contact layer is made of resin or metal, and for example, epoxy resin or polyimide resin may preferably be used.

As a material of the high acoustic velocity member, any of piezoelectric materials, such as aluminum nitride, aluminum oxide, silicon carbide, silicon nitride, silicon, sapphire, lithium tantalate, lithium niobate, and crystal, various types of ceramics such as alumina, zirconia, cordierite, mullite, steatite, and forsterite, magnesia, diamond, materials including the above-described respective materials as main components, and materials including mixtures of the above-described respective materials as main components may preferably be used.

The first piezoelectric substrate 8A is laminated on the first low acoustic velocity film 7A. First IDT electrodes 9A are laminated on the first piezoelectric substrate 8A. Each of the first IDT electrodes 9A preferably includes a multilayer body in which an Al layer including about 1 wt. % of Cu is laminated on a Ti layer, for example. The first IDT electrode may be made of appropriate metal or alloy. The first IDT electrode may include a single layer or may be defined by a multilayer body formed by laminating a plurality of metal films.

As described above, the first bandpass filter 3A preferably includes a first multilayer body 11A including the first high acoustic velocity substrate 6A, the first low acoustic velocity film 7A, the first piezoelectric substrate 8A, and the first IDT electrodes 9A. Therefore, a Q value is able to be increased as disclosed in International Publication No. 2012/086639.

The second bandpass filter 3B includes a second high acoustic velocity substrate 6B. The second high acoustic velocity substrate 6B is preferably the second support substrate defined by the second high acoustic velocity member. The second bandpass filter 3B preferably includes a second multilayer body 11B including the second high acoustic velocity substrate 6B, a second low acoustic velocity film 7B, the second piezoelectric substrate 8B, and second IDT electrodes 9B in order. The respective layers of the second multilayer body 11B have a relationship among the acoustic velocities, which is the same or substantially the same as that of the respective layers of the first multilayer body 11A. Therefore, the Q value is able to be increased. In the present preferred embodiment, the respective layers of the second multilayer body 11B are preferably made of the same materials as those of the respective layers of the first multilayer body 11A.

The thicknesses of the first and second high acoustic velocity substrates 6A and 6B are preferably about 200 μm, for example. The thicknesses of the first and second low acoustic velocity films 7A and 7B are preferably about 670 nm, for example. The thickness of the first piezoelectric substrate 8A is preferably about 600 nm, for example. The thickness of the second piezoelectric substrate 8B is preferably about 500 nm, for example. The thicknesses of the Ti layers of the first and second IDT electrodes 9A and 9B are preferably 12 nm and the thicknesses of the above-described Al layers are preferably 162 nm, for example. As details will be described later, the respective thicknesses are not limited thereto.

The first and second bandpass filters 3A and 3B are defined by different components and are mounted on a mounting substrate 14.

The present preferred embodiment has the following characteristics. 1) The thickness of the first piezoelectric substrate 8A and the thickness of the second piezoelectric substrate 8B are different from each other such that frequency ranges of high-order mode spurious radiation which is generated in the first and second bandpass filters 3A and 3B and pass bands of the third to sixth bandpass filters are different from each other. 2) The first and second bandpass filters 3A and 3B are defined by the different components. With these characteristics, attenuation in the respective pass bands of the third to sixth bandpass filters is able to be increased in filter characteristics of the first and second bandpass filters 3A and 3B. This effect will be described below together with the detail of the present preferred embodiment.

As illustrated in FIG. 3, the first and second bandpass filters 3A and 3B in the present preferred embodiment preferably have a WLP (Wafer Level Package) structure. To be more specific, in the first bandpass filter 3A, electrode lands 15 that are electrically connected to the first IDT electrodes 9A are provided on the first piezoelectric substrate 8A. The electrode lands 15 are preferably made of the same material as that of the first IDT electrodes 9A.

Support members 16 are provided on the first piezoelectric substrate 8A so as to surround the first IDT electrodes 9A when seen from the mounting substrate 14 side. The support members 16 have cavities facing the first IDT electrodes 9A. The support members 16 cover the electrode lands 15. The support members 16 are preferably made of an appropriate resin material.

A cover member 17 is provided on the support members 16 so as to cover the cavities of the support members 16. The cover member 17, the support members 16, and the first piezoelectric substrate 8A seal the first IDT electrodes 9A.

Under bump metal layers 18 penetrating through the cover member 17 and the support members 16 are provided such that ends thereof are connected to the electrode lands 15. The under bump metal layers 18 are preferably made of appropriate metal or alloy.

Bumps 19 are bonded to end portions of the under bump metal layers 18 at the opposite side to the electrode lands 15. The bumps 19 are preferably made of, for example, brazing filler metal such as solder. The first bandpass filter 3A is mounted on the mounting substrate 14 with the bumps 19 interposed therebetween. The first IDT electrodes 9A are electrically connected to the outside with the electrode lands 15, the under bump metal layers 18, and the bumps 19 interposed therebetween.

The second bandpass filter 3B also preferably has the WLP structure that is same or substantially the same as that of the first bandpass filter 3A. It should be noted that the first and second bandpass filters may not necessarily have the WLP structure.

Figure 4A:
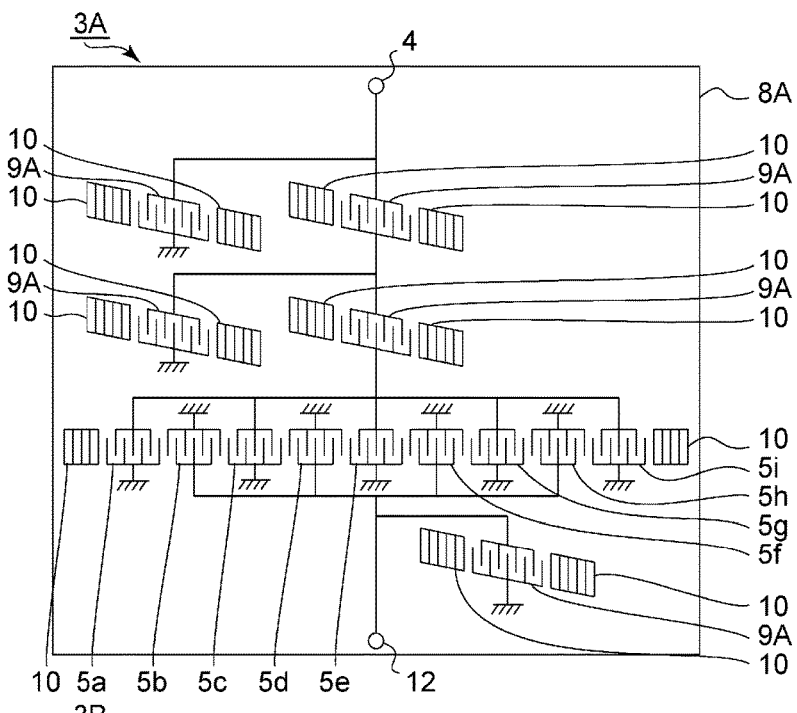
FIG. 4A is a schematic plan view of the first bandpass filter in the first preferred embodiment of the present invention and FIG. 4B is a schematic plan view illustrating the second bandpass filter in the first preferred embodiment of the present invention.
Figure 4B:
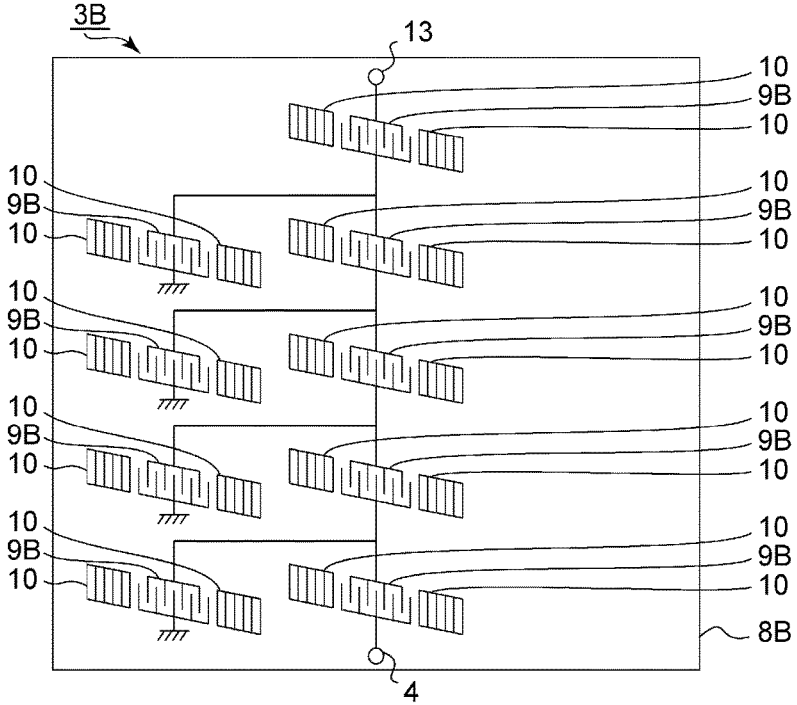

FIG. 4A is a schematic plan view of the first bandpass filter in the first preferred embodiment. FIG. 4B is a schematic plan view of the second bandpass filter in the first preferred embodiment. FIGS. 4A and 4B omit illustration of inductors. FIG. 4B omits illustration of a common connection portion of the parallel arm resonators.

As illustrated in FIG. 4A, the plurality of first IDT electrodes 9A are provided on the first piezoelectric substrate 8A. As illustrated in FIG. 4B, the plurality of second IDT electrodes 9B are provided on the second piezoelectric substrate 8B. Elastic waves are excited by applying voltages to the first and second IDT electrodes 9A and 9B illustrated in FIGS. 4A and 4B. Reflectors 10 are provided at both sides of the respective first and second IDT electrodes 9A and 9B in the elastic wave propagation direction. With this configuration, the respective resonators of the first and second bandpass filters 3A and 3B illustrated in FIG. 2 are provided. The reflectors 10 are preferably made of the same material as that of the first and second IDT electrodes 9A and 9B.

Each of the first and second IDT electrodes 9A and 9B includes a pair of opposing comb electrodes. Each of the comb electrodes includes a busbar and a plurality of electrode fingers ends of which are connected to the busbar. The plurality of electrode fingers of the pair of comb electrodes are interposed with each other. Each of the reflectors 10 includes a pair of busbars and a plurality of electrode fingers both ends of which are connected to the pair of busbars. The respective busbars of the first and second IDT electrodes 9A and 9B and the reflectors 10 in the preferred embodiment preferably extend in the direction inclined with respect to the elastic wave propagation direction. It should be noted that the extension directions of the respective busbars are not particularly limited. For example, the respective busbars may extend in parallel or substantially in parallel with the elastic wave propagation direction.

The first and second bandpass filters 3A and 3B in the present preferred embodiment have a circuit configuration illustrated in FIG. 2. To be more specific, the first bandpass filter 3A includes the resonators S11, S12, and P11 to P13 to adjust characteristics and the longitudinally coupled resonator elastic wave filter 5. The resonators S11 and S12 are connected in series between the antenna terminal 4 as an input terminal and the longitudinally coupled resonator elastic wave filter 5. The resonator P11 is connected between a connection point of the antenna terminal 4 and the resonator S11 and a ground potential. The resonator P12 is connected between a connection point of the resonator S11 and the resonator S12 and the ground potential. The resonator P13 is connected between a connection point of the longitudinally coupled resonator elastic wave filter 5 and an output terminal 12 and the ground potential.

In the second bandpass filter 3B, the series arm resonators S1 to S5 are connected in series between an input terminal 13 and the antenna terminal 4 as an output terminal. The parallel arm resonator P1 is connected between a connection point of the series arm resonator S1 and the series arm resonator S2 and the ground potential. The parallel arm resonator P2 is connected between a connection point of the series arm resonator S2 and the series arm resonator S3 and the ground potential. The parallel arm resonator P3 is connected between a connection point of the series arm resonator S3 and the series arm resonator S4 and the ground potential. The parallel arm resonator P4 is connected between a connection point of the series arm resonator S4 and the series arm resonator S5 and the ground potential. The parallel arm resonators P2 to P4 at the ground potential side are commonly connected to an inductor L1. The inductor L1 is connected to the ground potential.

The first duplexer 2A includes a branch point 4a at which a wiring connected to the antenna terminal 4 is branched into a wiring connecting the resonator S11 and the antenna terminal 4 and a wiring connecting the antenna terminal 4 and the series arm resonator S5. An impedance adjustment inductor L2 is connected between the antenna terminal 4 and the branch point 4a. In the same or similar manner, an inductor L3 is connected between a connection point of the resonator S11 and the resonator P11 and the branch point 4a. An inductor L4 is connected between the input terminal 13 and the series arm resonator S1. The circuit configuration of the first and second bandpass filters is not particularly limited.

Respective parameters of the series arm resonators S1 to S5 and the parallel arm resonators P1 to P4 of the second bandpass filter 3B are as indicated in the following Table 1. Respective parameters of the resonators S11, S12, and P11 to P13 of the first bandpass filter 3A are as indicated in the following Table 2. A wavelength in the specification is a value that is determined based on a distance between electrode finger centers of the IDT electrode of each resonator. In the present preferred embodiment, wavelengths in the respective reflectors of the series arm resonators S1 to S5, the parallel arm resonators P1 to P4, and the resonators S11, S12, and P11 to P13 are preferably the same or substantially the same as the wavelengths in the IDT electrodes of the respective resonators.

An intersecting width is a length of a portion in which a plurality of electrode fingers connected to different potentials overlap with each other in a direction in which the respective electrode fingers extend when the IDT electrode is seen along the elastic wave propagation direction.

As illustrated in FIG. 4A, the longitudinally coupled resonator elastic wave filter 5 of the first bandpass filter 3A preferably is a 9 IDT longitudinally coupled resonator elastic wave filter including nine IDT electrodes 5a to 5i. Narrow pitch portions with short distances between the electrode finger centers are provided in portions of the respective IDT electrodes 5a to 5i, which are adjacent to other IDT electrodes. Respective parameters of the longitudinally coupled resonator elastic wave filter 5 are as indicated in the following Table 3. When the wavelengths in the respective reflectors 10 of the longitudinally coupled resonator elastic wave filter 5 are $\lambda R$, the distances between the electrode finger centers of the respective reflectors 10 and the IDT electrodes 5a and 5i are preferably about 0.53 $\lambda R$, for example. It should be noted that the configuration of the longitudinally coupled resonator elastic wave filter is not particularly limited.

TABLE 1

|  | S1 | P1 | S2 | P2 | S3 | P3 | S4 | P4 | S5 |
|---|---|---|---|---|---|---|---|---|---|
| WAVELENGTH (μm) | 1.9926 | 2.0871 | 2.0163 | 2.1042 | 2.0142 | 2.0881 | 2.0167 | 2.0875 | 2.0043 |
| INTERSECTING WIDTH (μm) | 17.3 | 60.2 | 30 | 75.7 | 25 | 30.6 | 30.5 | 49.2 | 25 |
| NUMBER OF PAIRS OF ELECTRODE FINGERS OF IDT ELECTRODE (PAIRS) | 140 | 77 | 147 | 38 | 94 | 108 | 107 | 113 | 98 |
| NUMBER OF ELECTRODE FINGERS OF REFLECTOR (PIECES) | 21 | 21 | 21 | 21 | 21 | 21 | 21 | 21 | 21 |
| DUTY | 0.5 | 0.5 | 0.5 | 0.5 | 0.5 | 0.5 | 0.5 | 0.5 | 0.5 |

TABLE 2

|  | P11 | S11 | P12 | S12 | P13 |
|---|---|---|---|---|---|
| WAVELENGTH (μm) | 2.001 | 1.901 | 1.9707 | 1.8857 | 1.9629 |
| INTERSECTING WIDTH (μm) | 59.5 | 15.3 | 42 | 27.8 | 20 |
| NUMBER OF PAIRS OF ELECTRODE FINGERS OF IDT ELECTRODE (PAIRS) | 120 | 70 | 68 | 229 | 62 |
| NUMBER OF ELECTRODE FINGERS OF REFLECTOR (PIECES) | 31 | 31 | 31 | 31 | 31 |
| DUTY | 0.5 | 0.5 | 0.5 | 0.5 | 0.5 |

TABLE 3

| | WAVELENGTH (μm) | NUMBER OF PAIRS OF ELECTRODE FINGERS OF IDT ELECTRODE (PAIRS) | NUMBER OF ELECTRODE FINGERS OF REFLECTOR (PIECES) | DUTY |
|---|---|---|---|---|
| REFLECTOR | 1.9771 | — | 30 | 0.5 |
| IDT ELECTRODES 5a AND 5i MAIN | 1.9859 | 20.5 | — | 0.5 |
| IDT ELECTRODES 5a AND 5i NARROW PITCH | 1.7949 | 1.5 | — | 0.5 |
| IDT ELECTRODES 5b AND 5h NARROW PITCH (SIDES OF IDT ELECTRODES 5a AND 5i) | 1.8187 | 1.0 | — | 0.5 |
| IDT ELECTRODES 5b AND 5h MAIN | 1.9290 | 12.5 | — | 0.5 |
| IDT ELECTRODES 5b AND 5h NARROW PITCH (SIDES OF IDT ELECTRODES 5c AND 5g) | 1.8587 | 3.5 | — | 0.5 |
| IDT ELECTRODES 5c AND 5g NARROW PITCH (SIDES OF IDT ELECTRODES 5b AND 5h) | 1.8789 | 4.0 | — | 0.5 |
| IDT ELECTRODES 5c AND 5g MAIN | 1.9639 | 17.0 | — | 0.5 |
| IDT ELECTRODES 5c AND 5g NARROW PITCH (SIDES OF IDT ELECTRODES 5d AND 5f) | 1.8795 | 4.0 | — | 0.5 |
| IDT ELECTRODES 5d AND 5f NARROW PITCH (SIDES OF IDT ELECTRODES 5c AND 5g) | 1.8579 | 3.5 | — | 0.5 |
| IDT ELECTRODES 5d AND 5f MAIN | 1.9253 | 12.5 | — | 0.5 |
| IDT ELECTRODES 5d AND 5f NARROW PITCH (SIDE OF IDT ELECTRODES 5e) | 1.8253 | 1.0 | — | 0.5 |
| IDT ELECTRODES 5e NARROW PITCH | 1.8023 | 1.5 | — | 0.5 |
| IDT ELECTRODES 5e MAIN | 1.9791 | 33.0 | — | 0.5 |

As illustrated in FIG. 1, the second duplexer 2B includes the third and fourth bandpass filters 3C and 3D. The third duplexer 2C includes the fifth and sixth bandpass filters 3E and 3F. The third and fifth bandpass filter 3C and 3E are reception filters. The fourth and sixth bandpass filter 3D and 3F are transmission filters.

The pass bands of the first to sixth bandpass filters 3A to 3F are as follows. Pass band of first bandpass filter 3A: equal to or higher than about 1930 MHz and equal to or lower than about 1995 MHz (reception band of Band 25), for example. Pass band of second bandpass filter 3B: equal to or higher than about 1850 MHz and equal to or lower than about 1915 MHz (transmission band of Band 25), for example. Pass band of third bandpass filter 3C: equal to or higher than about 2105 MHz and equal to or lower than about 2155 MHz (reception band of Band 4), for example. Pass band of fourth bandpass filter 3D: equal to or higher than about 1705 MHz and equal to or lower than about 1755 MHz (transmission band of Band 4), for example. Pass band of fifth bandpass filter 3E: equal to or higher than about 2350 MHz and equal to or lower than about 2360 MHz (reception band of Band 30), for example. Pass band of sixth bandpass filter 3F: equal to or higher than about 2305 MHz and equal to or lower than about 2315 MHz (transmission band of Band 30), for example.

Characteristics of the present preferred embodiment will be described using a comparative example.

Figure 5:
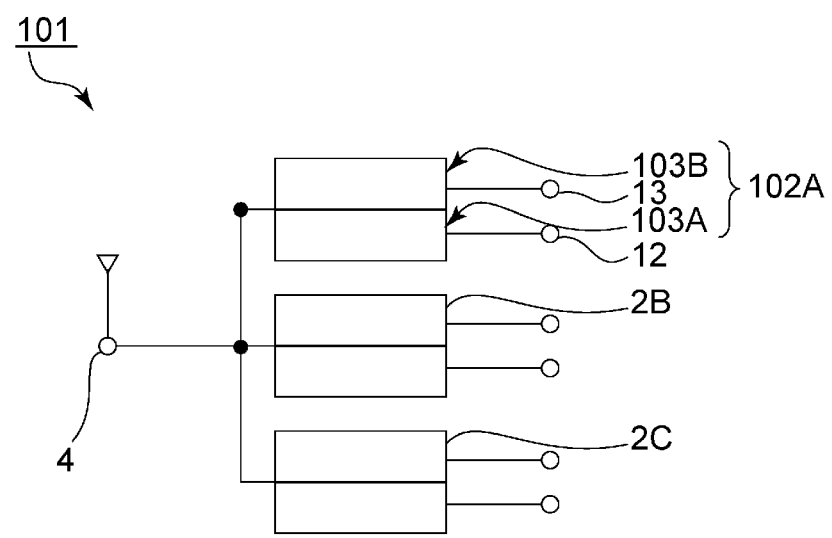
FIG. 5 is a schematic view of a multiplexer according to a comparative example.
Figure 6:
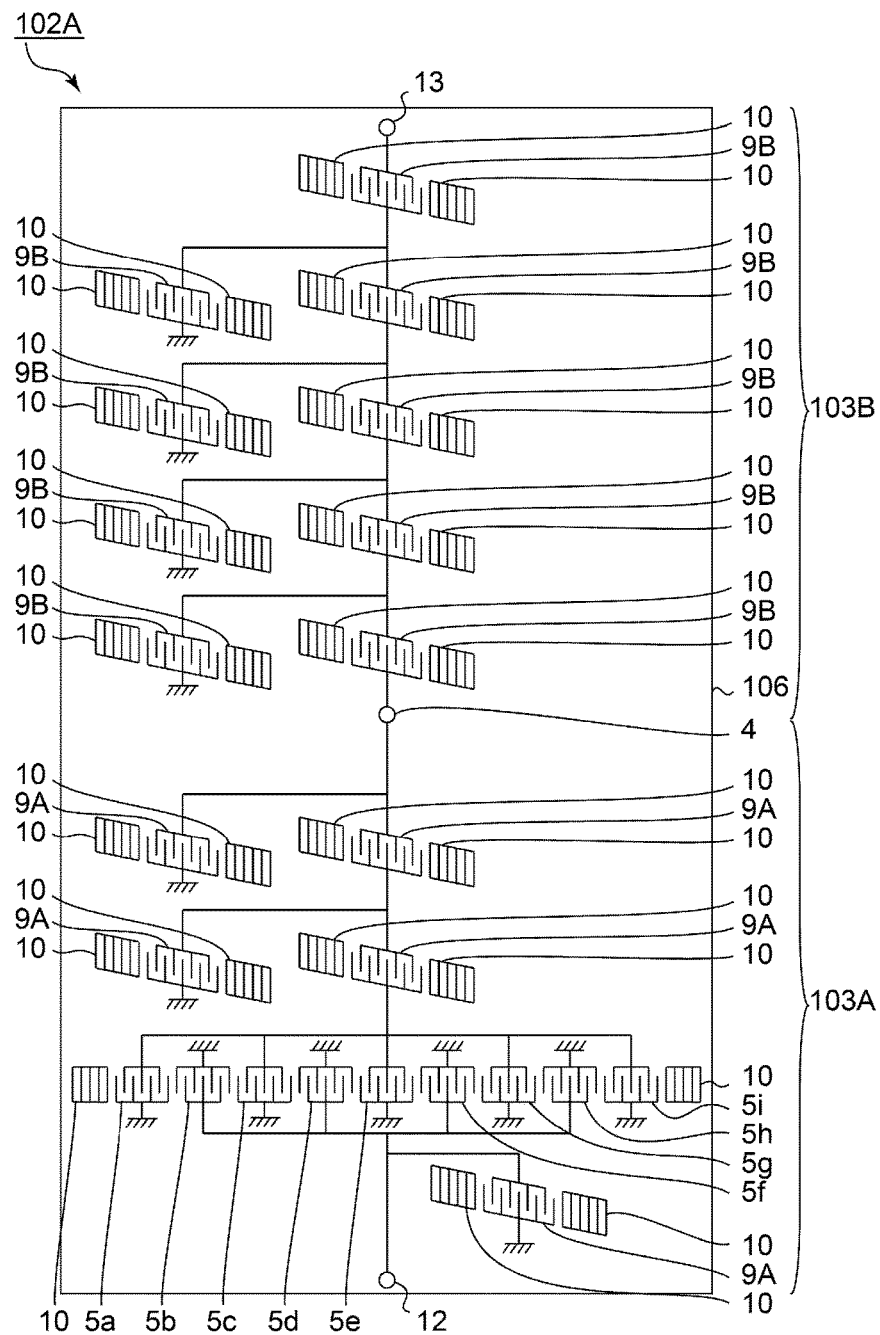
FIG. 6 is a schematic plan view of a first duplexer in the comparative example.

FIG. 5 is a schematic view of a multiplexer according to a comparative example. FIG. 6 is a schematic plan view of a first duplexer in the comparative example.

As illustrated in FIG. 5, in a multiplexer 101, the configuration of a first duplexer 102A is different from that in the first preferred embodiment. To be more specific, as illustrated in FIG. 6, the multiplexer 101 is different from that in the first preferred embodiment in that first and second bandpass filters 103A and 103B are provided on the same high acoustic velocity substrate 106. The multiplexer 101 illustrated in FIG. 5 has the same configuration as the multiplexer 1 in the first preferred embodiment other than the above-described point.

Figure 7:
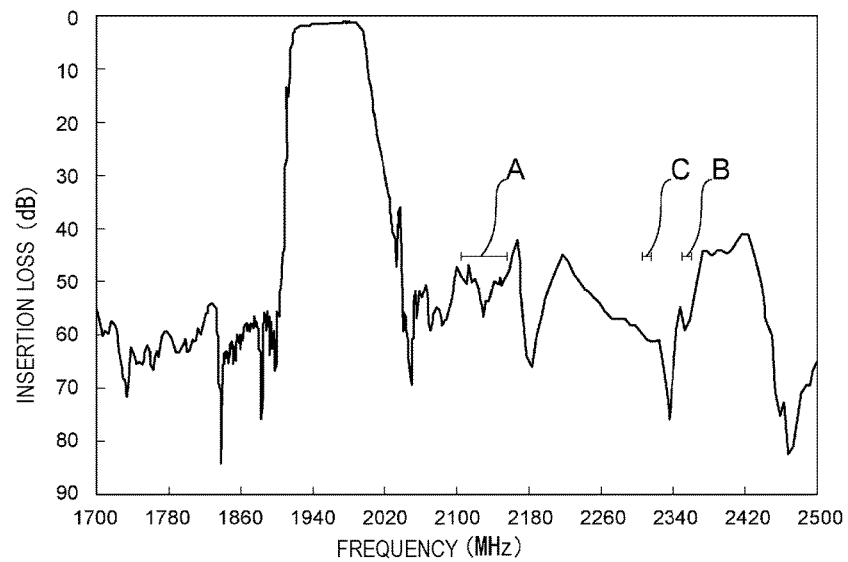
FIG. 7 is a graph illustrating attenuation-frequency characteristics of a first bandpass filter in the comparative example.
Figure 8:
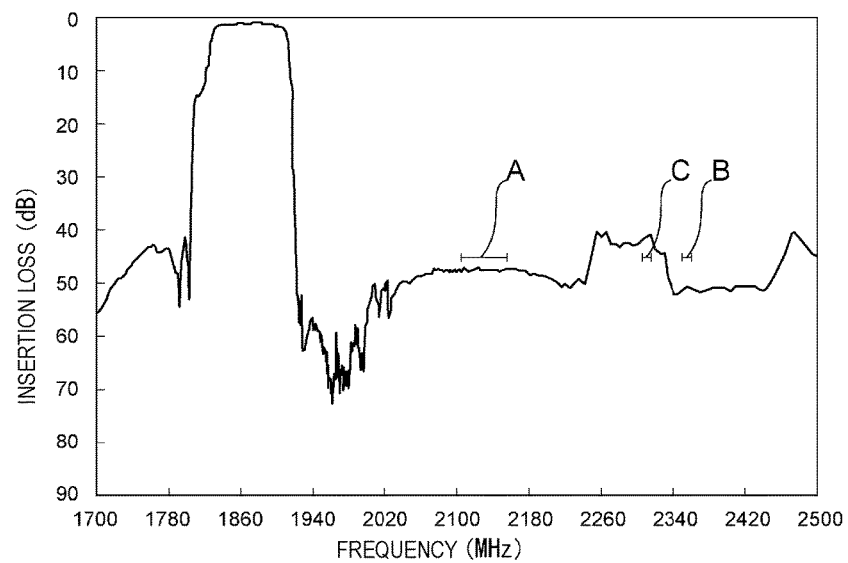
FIG. 8 is a graph illustrating attenuation-frequency characteristics of a second bandpass filter in the comparative example.

FIG. 7 is a graph illustrating attenuation-frequency characteristics of the first bandpass filter in the comparative example. FIG. 8 is a graph illustrating attenuation-frequency characteristics of the second bandpass filter in the comparative example. Pass bands A, B, and C in FIG. 7 and FIG. 8 indicate pass bands of third, fifth, and sixth bandpass filters, respectively. The same holds true in FIG. 9 and FIG. 10 which will be described later. A pass band of a fourth bandpass filter is located at the low-frequency side relative to the pass bands of the first and second bandpass filters.

As illustrated in FIG. 7, high-order mode spurious radiation is generated at the high-frequency side relative to the pass band of the first bandpass filter. A frequency range of the high-order mode spurious radiation in the first bandpass filter is different from all of the pass bands A, B, and C. As illustrated in FIG. 8, high-order mode spurious radiation in the second bandpass filter is generated in a frequency range including the pass band C. Therefore, attenuation in the pass band C of the sixth bandpass filter is small in the filter characteristics of the second bandpass filter in the comparative example.

In the comparative example, the configuration of a first multilayer body in the first bandpass filter has a large influence on the frequency band of the high-order mode spurious radiation in the second bandpass filter. In the same or similar manner, the configuration of a second multilayer body also has a large influence on the frequency band of the high-order mode spurious radiation in the first bandpass filter. Therefore, it is difficult to locate both of the frequency ranges of the high-order mode spurious radiation in the first and second bandpass filters in a frequency range which is different from the pass bands of the third to sixth bandpass filters.

Figure 9:
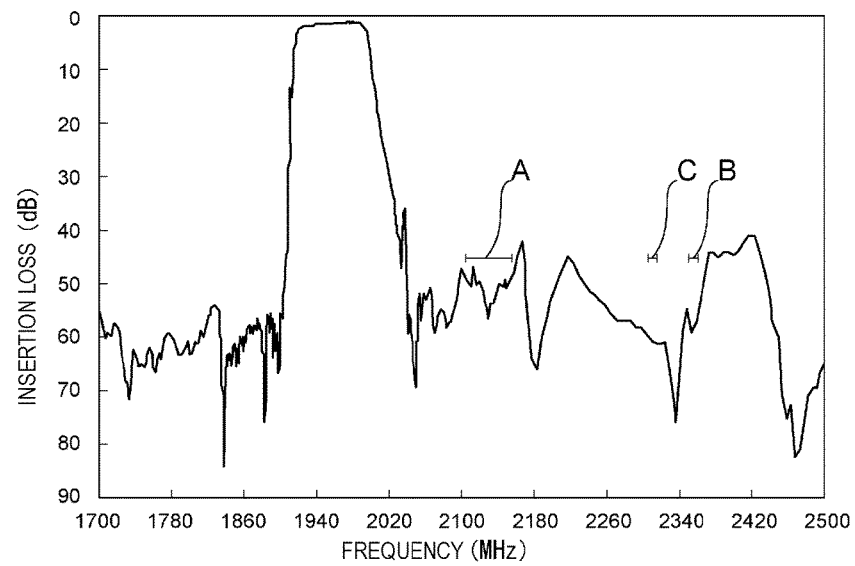
FIG. 9 is a graph illustrating attenuation-frequency characteristics of the first bandpass filter in the first preferred embodiment of the present invention.
Figure 10:
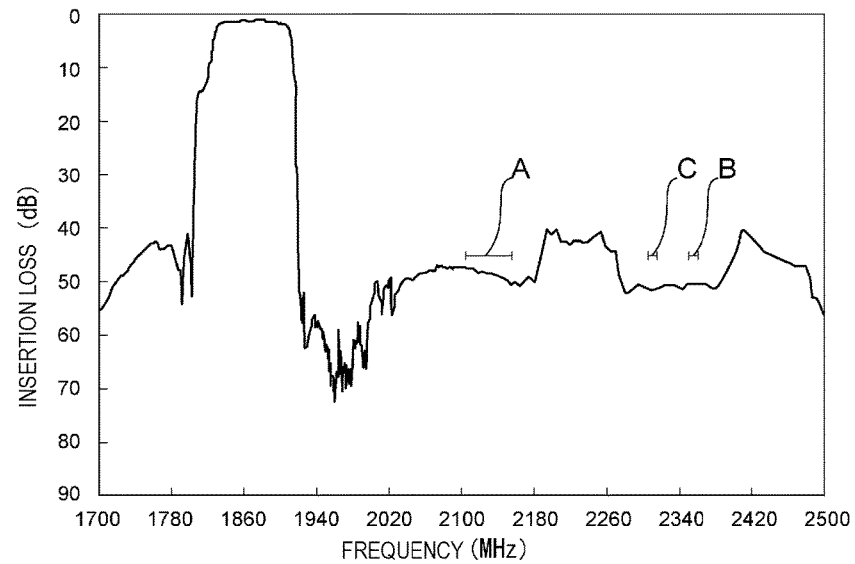
FIG. 10 is a graph illustrating attenuation-frequency characteristics of the second bandpass filter in the first preferred embodiment of the present invention.

FIG. 9 is a graph illustrating attenuation-frequency characteristics of the first bandpass filter in the first preferred embodiment. FIG. 10 is a graph illustrating attenuation-frequency characteristics of the second bandpass filter in the first preferred embodiment.

As illustrated in FIG. 9 and FIG. 10, in the first preferred embodiment, attenuation in the pass bands of the third to sixth bandpass filters is able to be increased in both of the first and second bandpass filters.

As illustrated in FIG. 3, in the first duplexer 2A in the present preferred embodiment, the first bandpass filter 3A and the second bandpass filter 3B are defined by the different components. With this configuration, the configuration of the first multilayer body 11A of the first bandpass filter 3A has less influence on the frequency band of the high-order mode spurious radiation in the second bandpass filter 3B. In the same or similar manner, the configuration of the second multilayer body 11B has less influence on the frequency band of the high-order mode spurious radiation in the first bandpass filter 3A.

Furthermore, the thickness of the first piezoelectric substrate 8A is preferably larger than the thickness of the second piezoelectric substrate 8B. To be more specific, the first multilayer body 11A is configured such that the frequency range of the high-order mode spurious radiation in the first bandpass filter 3A and the pass bands of the third to sixth bandpass filters are different from each other. The second multilayer body 11B is also configured such that the frequency range of the high-order mode spurious radiation in the second bandpass filter 3B and the pass bands of the third to sixth bandpass filters are different from each other. With this configuration, the attenuation in the respective pass bands of the third to sixth bandpass filters is able to be increased in the filter characteristics of the first and second bandpass filters 3A and 3B.

In the present preferred embodiment, the configurations of the first and second multilayer bodies 11A and 11B are made different from each other preferably by making the thicknesses of the first and second piezoelectric substrates 8A and 8B different from each other. The configuration of the first multilayer body and the configuration of the second multilayer body may be different from each other in elements other than the above-described element. For example, the thickness of the first low acoustic velocity film and the thickness of the second low acoustic velocity film may be different from each other. Alternatively, an Si crystal orientation in the first high acoustic velocity substrate and an Si crystal orientation in the second high acoustic velocity substrate may be different from each other. The thickness of the first IDT electrodes and the thickness of the second IDT electrodes may be different from each other. These elements may be made different such that the frequency ranges of the high-order mode spurious radiation in the first and second bandpass filters and the pass bands of the third to sixth bandpass filters are different from each other.

In the present preferred embodiment, the first support substrate is preferably the first high acoustic velocity substrate 6A defined by the first high acoustic velocity member. It is sufficient that the first support substrate is the support substrate including the first high acoustic velocity member. For example, the first high acoustic velocity member may be a first high acoustic velocity film having an acoustic velocity of propagating bulk waves, which is higher than the acoustic velocity of the elastic waves propagating in the first piezoelectric substrate. The first support substrate may be a support substrate on which the first high acoustic velocity film is laminated. In this case, it is preferable that the first low acoustic velocity film be laminated on the first support substrate at the first high acoustic velocity film side. With this configuration, the Q value is able to be effectively increased.

The second support substrate may also be a support substrate on which a second high acoustic velocity film is laminated in the same or substantially the same manner as the first support substrate. It is preferable that the second low acoustic velocity film be laminated on the second support substrate at the second high acoustic velocity film side.

In the present preferred embodiment, as illustrated in FIG. 1, the first bandpass filter 3A and the second bandpass filter 3B are provided on the support substrates which are different from those on which the third to sixth bandpass filters 3C to 3F are provided.

The third to sixth bandpass filters 3C to 3F preferably include multilayer bodies each having relationships of acoustic velocities, which are the same or substantially the same as those in the above-described first and second multilayer bodies. Therefore, the Q values are increased in the respective pass bands. Furthermore, the configurations of the first and second multilayer bodies and the configurations of the respective multilayer bodies of the third to sixth bandpass filters 3C to 3F are provided as different components and they, therefore, do not substantially influence one another. Accordingly, the attenuation in other pass bands is able to be increased in the filter characteristics of the respective bandpass filters.

It should be noted that the first bandpass filter may be provided on the same support substrate as that on which at least one bandpass filter among the third to sixth bandpass filters is provided. In the same or similar manner, the second bandpass filter may also be provided as an integrated component with at least one bandpass filter among the third to sixth bandpass filters.

Also in these cases, the same or substantially the same effects as those in the first International Publication No. 2012/086639 are able to be provided. Furthermore, the multiplexer is able to be reduced in size.

It is sufficient that the multiplexer according to a preferred embodiment of the present invention includes the first duplexer and other configurations are not particularly limited. For example, the multiplexer may include a bandpass filter that does not define the duplexer or may include a filter defining a triplexer or the like having more than two bandpass filters.

Figure 11:
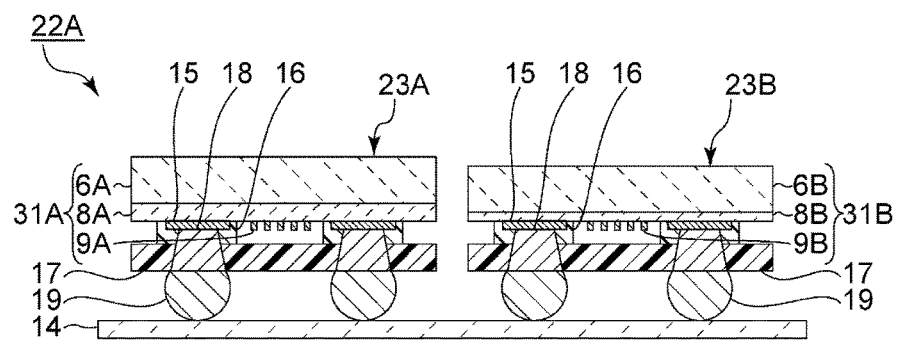
FIG. 11 is a schematic cross-sectional front view in a state in which a first duplexer is mounted on a mounting substrate in a second preferred embodiment of the present invention.

FIG. 11 is a schematic cross-sectional front view of a first duplexer in a second preferred embodiment of the present invention.

In a multiplexer according to the second preferred embodiment, the configuration of a first duplexer 22A is different from that in the first preferred embodiment. To be more specific, the configurations of first and second multilayer bodies 31A and 31B of the first duplexer 22A are different from those in the first preferred embodiment. The multiplexer in the present preferred embodiment has the same or substantially the same configuration as that of the multiplexer 1 in the first preferred embodiment other than the above-described point.

The first multilayer body 31A is a multilayer body formed preferably by laminating the first high acoustic velocity substrate 6A, the first piezoelectric substrate 8A, and the first IDT electrodes 9A in this order. The first multilayer body 31A does not include a low acoustic velocity film. The second multilayer body 31B is a multilayer body formed by laminating the second high acoustic velocity substrate 6B, the second piezoelectric substrate 8B, and the second IDT electrodes 9B in this order. The second multilayer body 31B also does not include a low acoustic velocity film.

In the first multilayer body 31A, the first high acoustic velocity substrate 6A, and the first piezoelectric substrate 8A may preferably be bonded to each other with, for example, an adhesive. In the second multilayer body 31B, the second high acoustic velocity substrate 6B and the second piezoelectric substrate 8B may also preferably be bonded to each other with, for example, an adhesive.

Also in this case, Q values are able to be increased in the first and second bandpass filters 23A and 23B. Furthermore, as in the first preferred embodiment, attenuation in pass bands of other bandpass filters is able to be increased in filter characteristics of the first duplexer 22A.

Figure 12:
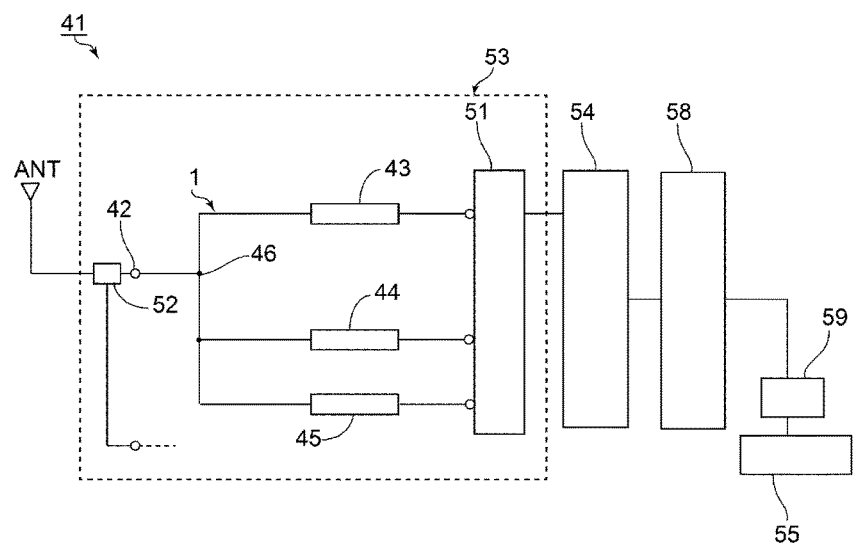
FIG. 12 is a circuit diagram for explaining a communication apparatus as a third preferred embodiment of the present invention.

FIG. 12 is a circuit diagram for explaining a communication apparatus according to a third preferred embodiment of the present invention. In a communication apparatus 41, ends of first to third bandpass filters 43 to 45 are commonly connected to an antenna common terminal 42 with a common connection point 46 interposed therebetween. The first to third bandpass filters 43 to 45 and an LNA (low noise amplifier) 51 are connected. A switch 52 is connected to the antenna common terminal 42. A portion from the switch 52 to the LNA 51 defines a high-frequency front end circuit 53. The LNA 51 of the high-frequency front end circuit 53 is connected to an RFIC 54. The RFIC 54 is connected to a BBIC (Base Band IC) 58, a CPU 59, and a display 55. The communication apparatus 41 includes the above-described high-frequency front end circuit 53, the RFIC 54, the BBIC 58, the CPU 59, and the display 55.

The multiplexers according to preferred embodiments of the present invention may be applied to a portion in which the first to third bandpass filters 43 to 45 are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer which is provided on a mounting substrate,
the multiplexer comprising:
an antenna terminal; and
a plurality of bandpass filters that are commonly connected to the antenna terminal and have different pass bands; wherein
the plurality of bandpass filters include first and second bandpass filters including first and second piezoelectric substrates and at least one bandpass filter other than the first and second bandpass filters, and the first and second bandpass filters define a duplexer;
the first bandpass filter includes a first multilayer body in which the first piezoelectric substrate is laminated on a first support substrate including a first high acoustic velocity member having an acoustic velocity of propagating bulk waves, which is higher than an acoustic velocity of elastic waves propagating in the first piezoelectric substrate, and a first IDT electrode is laminated on the first piezoelectric substrate;
the second bandpass filter includes a second multilayer body in which the second piezoelectric substrate is laminated on a second support substrate including a second high acoustic velocity member having an acoustic velocity of propagating bulk waves, which is higher than an acoustic velocity of elastic waves propagating in the second piezoelectric substrate, and a second IDT electrode is laminated on the second piezoelectric substrate;
the first bandpass filter and the second bandpass filter are different components on the mounting substrate; and
a configuration of the first multilayer body and a configuration of the second multilayer body are different from each other such that frequency ranges of high-order mode spurious radiation which is generated in the first and second bandpass filters and a pass band of the band pass filter other than the first and second bandpass filters among the plurality of bandpass filters are different from each other.

2. The multiplexer according to claim 1, wherein
the first multilayer body includes a first low acoustic velocity film that is laminated between the first support substrate and the first piezoelectric substrate and has an acoustic velocity of propagating bulk waves, which is lower than the acoustic velocity of the elastic waves propagating in the first piezoelectric substrate; and
the second multilayer body includes a second low acoustic velocity film that is laminated between the second support substrate and the second piezoelectric substrate and has an acoustic velocity of propagating bulk waves, which is lower than the acoustic velocity of the elastic waves propagating in the second piezoelectric substrate.

3. The multiplexer according to claim 2, wherein a thickness of the first low acoustic velocity film and a thickness of the second low acoustic velocity film are different from each other.

4. The multiplexer according to claim 1, wherein a thickness of the first IDT electrode and a thickness of the second IDT electrode are different from each other.

5. The multiplexer according to claim 1, wherein a thickness of the first piezoelectric substrate and a thickness of the second piezoelectric substrate are different from each other.

6. The multiplexer according to claim 1, wherein the first support substrate is a first high acoustic velocity substrate defined by the first high acoustic velocity member and the second support substrate is a second high acoustic velocity substrate defined by the second high acoustic velocity member.

7. The multiplexer according to claim 6, wherein the first high acoustic velocity substrate and the second high acoustic velocity substrate are made of Si and a crystal orientation in the first high acoustic velocity substrate and a crystal orientation in the second high acoustic velocity substrate are different from each other.

8. The multiplexer according to claim 1, wherein the first and second piezoelectric substrates are made of $LiTaO_3$.

9. The multiplexer according to claim 1, wherein the first bandpass filter or the second bandpass filter is provided on a same support substrate as at least one bandpass filter of the plurality of bandpass filters other than the first and second bandpass filters, and is defined by an integrated component.

10. The multiplexer according to claim 1, wherein the first bandpass filter, the second bandpass filter, and the bandpass filter other than the first and second bandpass filters are provided on different support substrates and are different components.

11. A high-frequency front end circuit comprising the multiplexer according to claim 1.

12. A communication apparatus comprising the multiplexer according to claim 1.

13. A multiplexer, comprising:
an antenna terminal; and
a plurality of bandpass filters that are commonly connected to the antenna terminal and have different pass bands; wherein
the plurality of bandpass filters include first and second bandpass filters including first and second piezoelectric substrates and at least one bandpass filter other than the first and second bandpass filters, and the first and second bandpass filters define a duplexer;
the first bandpass filter includes a first multilayer body in which a first low acoustic velocity film having an acoustic velocity of propagating bulk waves, which is lower than an acoustic velocity of elastic waves propagating in the first piezoelectric substrate, is laminated on a first high acoustic velocity substrate having an acoustic velocity of propagating bulk waves, which is higher than the acoustic velocity of the elastic waves propagating in the first piezoelectric substrate, the first piezoelectric substrate is laminated on the first low acoustic velocity film, and a first IDT electrode is laminated on the first piezoelectric substrate, and the first bandpass filter is a reception filter having a pass band of equal to or higher than about 1930 MHz and equal to or lower than about 1995 MHz;

the second bandpass filter includes a second multilayer body in which a second low acoustic velocity film having an acoustic velocity of propagating bulk waves, which is lower than an acoustic velocity of elastic waves propagating in the second piezoelectric substrate, is laminated on a second high acoustic velocity substrate having an acoustic velocity of propagating bulk waves, which is higher than the acoustic velocity of the elastic waves propagating in the second piezoelectric substrate, the second piezoelectric substrate is laminated on the second low acoustic velocity film, and a second IDT electrode is laminated on the second piezoelectric substrate, and the second bandpass filter is a transmission filter having a pass band of equal to or higher than about 1850 MHz and equal to or lower than about 1915 MHz; and
a thickness of the first piezoelectric substrate is larger than a thickness of the second piezoelectric substrate.

14. The multiplexer according to claim 13, wherein frequency ranges of high-order mode spurious radiation which is generated in the first and second bandpass filters are different from all of frequency ranges of equal to or higher than about 1705 MHz and equal to or lower than about 1755 MHz, equal to or higher than about 2105 MHz and equal to or lower than about 2155 MHz, equal to or higher than about 2305 MHz and equal to or lower than about 2315 MHz, and equal to or higher than about 2350 MHz and equal to or lower than about 2360 MHz.

15. The multiplexer according to claim 13, wherein a thickness of the first low acoustic velocity film and a thickness of the second low acoustic velocity film are different from each other.

16. The multiplexer according to claim 13, wherein a thickness of the first IDT electrode and a thickness of the second IDT electrode are different from each other.

17. The multiplexer according to claim 13, wherein the first high acoustic velocity substrate and the second high acoustic velocity substrate are made of Si and a crystal orientation in the first high acoustic velocity substrate and a crystal orientation in the second high acoustic velocity substrate are different from each other.

18. The multiplexer according to claim 13, wherein the first and second piezoelectric substrates are made of $LiTaO_3$.

19. A high-frequency front end circuit comprising the multiplexer according to claim 13.

20. A communication apparatus comprising the multiplexer according to claim 13.

* * * * *